US010541109B2

(12) United States Patent
Stanfill et al.

(10) Patent No.: US 10,541,109 B2
(45) Date of Patent: Jan. 21, 2020

(54) SENSING ANALYTICAL INSTRUMENT PARAMETERS, SPECIMEN CHARACTERISTICS, OR BOTH FROM SPARSE DATASETS

(71) Applicant: BATTELLE MEMORIAL INSTITUTE, Richland, WA (US)

(72) Inventors: Bryan A. Stanfill, Richland, WA (US); Sarah M. Reehl, Richland, WA (US); Margaret C. Johnson, Cary, NC (US); Lisa M. Bramer, Kennewick, WA (US); Nigel D. Browning, Richland, WA (US); Andrew J. Stevens, Richland, WA (US); Libor Kovarik, West Richland, WA (US)

(73) Assignee: BATTELLE MEMORIAL INSTITUTE, Richland, WA (US)

( * ) Notice: Subject to any disclaimer, the term of this patent is extended or adjusted under 35 U.S.C. 154(b) by 206 days.

(21) Appl. No.: 15/660,096

(22) Filed: Jul. 26, 2017

(65) Prior Publication Data
US 2018/0033591 A1    Feb. 1, 2018

Related U.S. Application Data

(60) Provisional application No. 62/367,605, filed on Jul. 27, 2016.

(51) Int. Cl.
*H01J 37/26* (2006.01)
*H01J 37/06* (2006.01)
*H01J 37/244* (2006.01)

(52) U.S. Cl.
CPC ............ *H01J 37/265* (2013.01); *H01J 37/06* (2013.01); *H01J 37/244* (2013.01)

(58) Field of Classification Search
None
See application file for complete search history.

(56) References Cited

U.S. PATENT DOCUMENTS

| 4,589,773 | A  | * | 5/1986 | Ido | G01B 11/026 |
| | | | | | 250/205 |
| 7,106,425 | B1 | * | 9/2006 | Bultman | G01N 21/211 |
| | | | | | 356/237.2 |
| 9,620,330 | B2 | * | 4/2017 | Potoček | G02B 21/0048 |
| 9,874,582 | B2 | * | 1/2018 | Humphris | G01Q 10/045 |
| 2005/0012936 | A1 | * | 1/2005 | Murayama | B82Y 35/00 |
| | | | | | 356/601 |

(Continued)

FOREIGN PATENT DOCUMENTS

| EP | 0225969 A1 | * | 6/1987 | ........... G01R 31/305 |
| EP | 0225969 A1 | * | 6/1987 | ........... G01R 31/305 |

(Continued)

*Primary Examiner* — Andrew Smyth
(74) *Attorney, Agent, or Firm* — Derek H. Maughan

(57) ABSTRACT

Disclosed are methods for sensing conditions of an electron microscope system and/or a specimen analyzed thereby. Also disclosed are sensor systems and electron microscope systems able to sense system conditions, and/or conditions of the specimen being analyzed by such systems. In one embodiment, a sparse dataset can be acquired from a random sub-sampling of the specimen by an electron beam probe of the electron microscope system. Instrument parameters, specimen characteristics, or both can be estimated from the sparse dataset.

22 Claims, 12 Drawing Sheets

(56) References Cited

U.S. PATENT DOCUMENTS

| | | | | |
|---|---|---|---|---|
| 2009/0028423 A1* | 1/2009 | Sandstrom | ........... | G01N 21/956 |
| | | | | 382/149 |
| 2009/0179161 A1* | 7/2009 | Ward | ..................... | B82Y 10/00 |
| | | | | 250/492.21 |
| 2013/0147916 A1* | 6/2013 | Bennett | .................. | G01B 11/24 |
| | | | | 348/46 |
| 2015/0069233 A1* | 3/2015 | Anderson | .............. | H01J 37/222 |
| | | | | 250/307 |
| 2015/0377921 A1* | 12/2015 | Ukraintsev | ............ | G01Q 30/02 |
| | | | | 324/750.19 |
| 2016/0111247 A1* | 4/2016 | Potocek | .................. | H01J 37/21 |
| | | | | 250/307 |
| 2017/0016932 A1* | 1/2017 | Humphris | ............ | G01Q 10/045 |

FOREIGN PATENT DOCUMENTS

| | | | | |
|---|---|---|---|---|
| EP | 0225969 B1 * | 3/1990 | ........... | G01R 31/305 |
| EP | 0225969 B1 * | 3/1990 | ........... | G01R 31/305 |

\* cited by examiner

SENSING ANALYTICAL INSTRUMENT PARAMETERS, SPECIMEN CHARACTERISTICS, OR BOTH FROM SPARSE DATASETS

CROSS-REFERENCE TO RELATED APPLICATIONS

This application is related to, and claims priority from, U.S. provisional patent application 62/367,605, entitled Compressive Estimation of Information in Microscope Systems filed Jul. 27, 2016. The entire disclosure of the application is incorporated herein by reference.

ACKNOWLEDGEMENT OF GOVERNMENT SUPPORT

This invention was made with Government support under Contract DE-AC0576RL01830 awarded by the U.S. Department of Energy. The Government has certain rights in the invention.

FIELD

The present disclosure relates generally to analytical imaging systems and their operation as well as to measurements performed by such systems; it relates more particularly to electron microscope systems and their operation as well as to measurements performed by such systems sub-sampling a specimen.

BACKGROUND

Electron microscopy is a powerful tool that can provide high spatial and temporal resolution of nanoscale objects and processes. However, the large doses of electrons required to deliver such resolution can present problems including observer effects and/or damage to the specimen. Furthermore, even making operational adjustments to the microscope can increase the electron dose, exacerbating the problems. A need exists for electron microscopes that are simple to operate and that efficiently sample and process measurements.

SUMMARY

Disclosed are methods for sensing conditions of an electron microscope system and/or a specimen analyzed thereby. Also disclosed are sensor systems and electron microscope systems able to sense system conditions, and/or conditions of the specimen being analyzed by such systems. In one embodiment, a sparse dataset can be acquired from a sub-sampling of the specimen by an electron beam probe of the electron microscope system. Instrument parameters, specimen characteristics, or both can be estimated from the sparse dataset. In some embodiments, the estimations are independent of reconstructions of a complete image using computational imaging techniques.

Generally, sub-sampling paired with computational imaging techniques such as compressive sensing have shown great promise in minimizing observer effects, specimen damage, and/or acquisition times. The inventors have determined that the instrument parameters and/or specimen characteristics can be estimated from the sparse dataset generated by sub-sampling. Preferably, the instrument parameters and/or specimen characteristics are estimated prior to computationally reconstructing an image of the specimen, or even without computationally reconstructing an image of the specimen. Estimation of instrument parameters and/or specimen characteristics from the sparse dataset can provide increased efficiency because often times, image reconstruction is a time-consuming process and, in many cases, the qualitative and/or quantitative analytical information extracted from the reconstructed images are more important than the images themselves. At the same time, a human operator is not typically capable of making determinations of the instrument parameters and/or specimen characteristics from sparse datasets absent sensor systems and sensing methods as described herein.

In one embodiment, a method for sensing conditions of an electron microscope system, a specimen analyzed thereby, comprises the steps of acquiring a sparse dataset from a sub-sampling of the specimen by an electron beam probe of the electron microscope system; and estimating instrument parameters, specimen characteristics, or both from the sparse datset. In certain embodiments, the method further comprises applying an adjustment to an electron microscope system component after said estimating step, the adjustment associated with the instrument parameters, the specimen characteristics, or both. In certain embodiments, the specimen characteristic comprises feature dimension, composition, frequency count of one or more features, or combinations thereof. In certain embodiments, the instrument parameter comprises specimen tilt, instrument drift, drift velocity, image focus, or combinations thereof. In certain embodiments, the estimating step further comprises estimating prior to computationally reconstructing an image of the specimen, or without computationally reconstructing an image of the specimen. In certain embodiments, the estimating step further comprises determining a baseline state of the specimen, the electron microscope system, or both; quantifying the distance of subsequent states of the specimen, the electron microscope, or both from the baseline state; and comparing the subsequent states to the baseline state. In certain embodiments, the sub-sampling further comprises sub-sampling in a serial mode. In certain embodiments, the sparse data comprises streaming sparse data and said acquiring step further comprises acquiring in a continuous or batch-wise manner the streaming sparse data. In certain embodiments, the acquiring in a continuous or batch-wise manner occurs substantially in real-time. In certain embodiments, the method further comprises analyzing in an operando or in-situ manner the specimen in the electron microscope system. In certain embodiments, the sub-sampling comprises a random sub-sampling of the specimen.

In some embodiments, a sensor system comprises a detector configured to acquire a sparse dataset from an electron beam probe arranged to sub-sample a specimen; and processing circuitry coupled to the detector and configured to estimate instrument parameters, specimen characteristics, or both from the sparse dataset. In certain embodiments, the specimen characteristic is one of a feature dimension, a composition, and a frequency count of a feature. In certain embodiments, the instrument parameter is one of specimen tilt, instrument drift, drift velocity, and image focus. In certain embodiments, the processing circuitry is further configured to estimate instrument parameters, specimen characteristics, or both from the sparse dataset prior to computationally reconstructing an image of the specimen, or without computationally reconstructing an image of the specimen. In certain embodiments, the electron beam probe, the detector, or both are further arranged to randomly sub-sample the specimen in a serial mode. Examples of detectors for electron microscope systems can include, but are not limited to bright field STEM, annular STEM, pixelated, and spectral detectors. The detectors can be above or below the specimen. In certain embodiments, the sparse data comprises streaming sparse data and the detector is further configured to acquire in a continuous or batch-wise manner. In certain embodiments, the processing circuitry is configured to estimate substantially in real-time. In certain embodiments, the processing circuitry is further configured to determine a baseline state of the specimen, the electron microscope system, or both; quantify the distance of subsequent states of the specimen, the electron microscope, or both from the baseline state; and compare the subsequent states to the baseline state. In certain embodiments, the processing circuitry is further configured to issue instrument control commands to operably connected electron microscope system components, the instrument control commands associated with the instrument parameters, the specimen characteristics, or both.

In some embodiments, an electron microscope system comprises an electron beam probe configured to sub-sample a specimen in a serial mode; a detector configured to acquire a sparse dataset from the electron beam probe sub-sampling the specimen; and processing circuitry coupled to the detector and configured to estimate instrument parameters, specimen characteristics, or both from the sparse dataset prior to computational reconstruction of an image of the specimen, or without computational reconstruction of an image of the specimen. In certain embodiments, the electron beam probe is further configured to randomly sub-sample the specimen in a serial mode.

In one embodiment, a method for sensing conditions of an analytical instrument, a specimen analyzed thereby, or both, comprises the steps of acquiring a sparse dataset from a random sub-sampling of the specimen by an analytical probe of the analytical instrument; and estimating instrument parameters, specimen characteristics, or both from the sparse dataset. In certain embodiments, the analytical probe is one of a charged particle beam, a neutral particle beam, an electromagnetic beam, and a physical tip. In certain embodiments, the method further comprises applying an adjustment to an analytical instrument component after said estimating step, the adjustment associated with the instrument parameters, the specimen characteristics, or both. In certain embodiments, the specimen characteristic is one of feature dimension, composition, and frequency count of one or more features. In certain embodiments, the instrument parameter is one of specimen tilt, instrument drift, drift velocity, and image focus. In certain embodiments, the estimating step further comprises estimating prior to computationally reconstructing an image of the specimen, or without computationally reconstructing an image of the specimen. In certain embodiments, the method further comprises operating the analytical instrument to analyze the specimen, wherein the estimating step occurs substantially concurrently with the operating. In certain embodiments, the sub-sampling further comprises sub-sampling in a serial mode. In certain embodiments, the sparse data comprises streaming sparse data and said acquiring step further comprises acquiring in a continuous or batch-wise manner the streaming sparse data. In certain embodiments, the acquiring in a continuous or batch-wise manner occurs substantially in real-time. In certain embodiments, the method further comprises analyzing in an operando or in-situ manner the specimen in the analytical instrument.

In one embodiment, an analytical instrument sensor system comprises a detector configured to acquire a sparse dataset from an analytical probe arranged to randomly sub-sample a specimen; processing circuitry coupled to the detector and configured to estimate instrument parameters, specimen characteristics, or both from the sparse dataset. In certain embodiments, the specimen characteristic is one of a feature dimension, a composition, and a frequency count of a feature. In certain embodiments, the instrument parameter is one of specimen tilt, instrument drift, drift velocity, and image focus. In certain embodiments, the processing circuitry is further configured to estimate instrument parameters, specimen characteristics, or both from the sparse dataset prior to computationally reconstructing an image of the specimen, or without computationally reconstructing an image of the specimen. In certain embodiments, the analytical probe, the detector, or both is further arranged to randomly sub-sample the specimen in a serial mode. In certain embodiments, the sparse data comprises streaming sparse data and the detector is further configured to acquire in a continuous or batch-wise manner. In certain embodiments, the processing circuitry is configured to estimate substantially in real-time. In certain embodiments, the detector is further configured to substantially concurrently acquire an analytical dataset from the specimen and the analytical probe. In certain embodiments, the processing circuitry is further configured to issue instrument control commands to operably connected analytical instrument components, the instrument control commands associated with the instrument parameters, the specimen characteristics, or both.

In one embodiment, an analytical imaging instrument system comprises an analytical probe configured to randomly sub-sample a specimen in a serial mode; a detector configured to acquire a sparse dataset from the analytical probe sub-sampling the specimen; and processing circuitry coupled to the detector and configured to estimate instrument parameters, specimen characteristics, or both from the sparse dataset prior to computational reconstruction of an image of the specimen, or without computational reconstruction of an image of the specimen. In certain embodiments, the analytical probe is one of a charged particle beam, a neutral particle beam, an electromagnetic beam, and a physical tip. In certain embodiments, the analytical probe comprises an electron beam and the analytical imaging system is one of a transmission electron microscope, a scanning electron microscope, and a scanning transmission electron microscope.

The purpose of the foregoing summary and the latter abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. Neither the summary nor the abstract is intended to define the invention of the application, which is measured by the claims, nor is it intended to be limiting as to the scope of the claims in any way.

BRIEF DESCRIPTION OF THE DRAWINGS

FIG. 3A contains images of lithium dendrite formation on an anode at different times (i.e., frames from a movie). FIG. 3B is a chart comparing intensity distributions between the two frames.

FIG. 9A is a complete image showing lithium (bright areas) deposited on an anode (dark region). FIG. 9B is a sub-sampled image (10% sub-sampling) representing a sparse dataset corresponding the that shown in FIG. 9A and used for subsequent analysis. FIG. 9C. is a graph of pixel intensity as a function of x-coordinate and indicates a linear increase from left to right of the image in FIG. 9B. FIG. 9D is a histogram of detrended pixel intensity values and can be described by a mixture of four normal distributions. FIG. 9E-9G are images showing only pixels where lithium growth is sensed (i.e., estimated) according to embodiments disclosed herein and using various spatio-temporal corrections; $r=5$, $\gamma=0.05$ in FIG. 9F; $r=20$, $\gamma=0.2$ in FIG. 9G.

FIG. 11A shows repeated analyses to assess the uncertainty associated with the down-sampling strategy. The 10th (long-dashes line), 50th (solid black) and 90th (dotted) percentiles of the repeated analyses are plotted for the 10% (FIG. 11B), 5% (FIG. 11C) and 1% (FIG. 11D) sub-samplings. The short-dashes line in FIGS. 11B, 11C, and 11D represents the growth curve estimated using all of the pixels.

DETAILED DESCRIPTION

Figure 1:
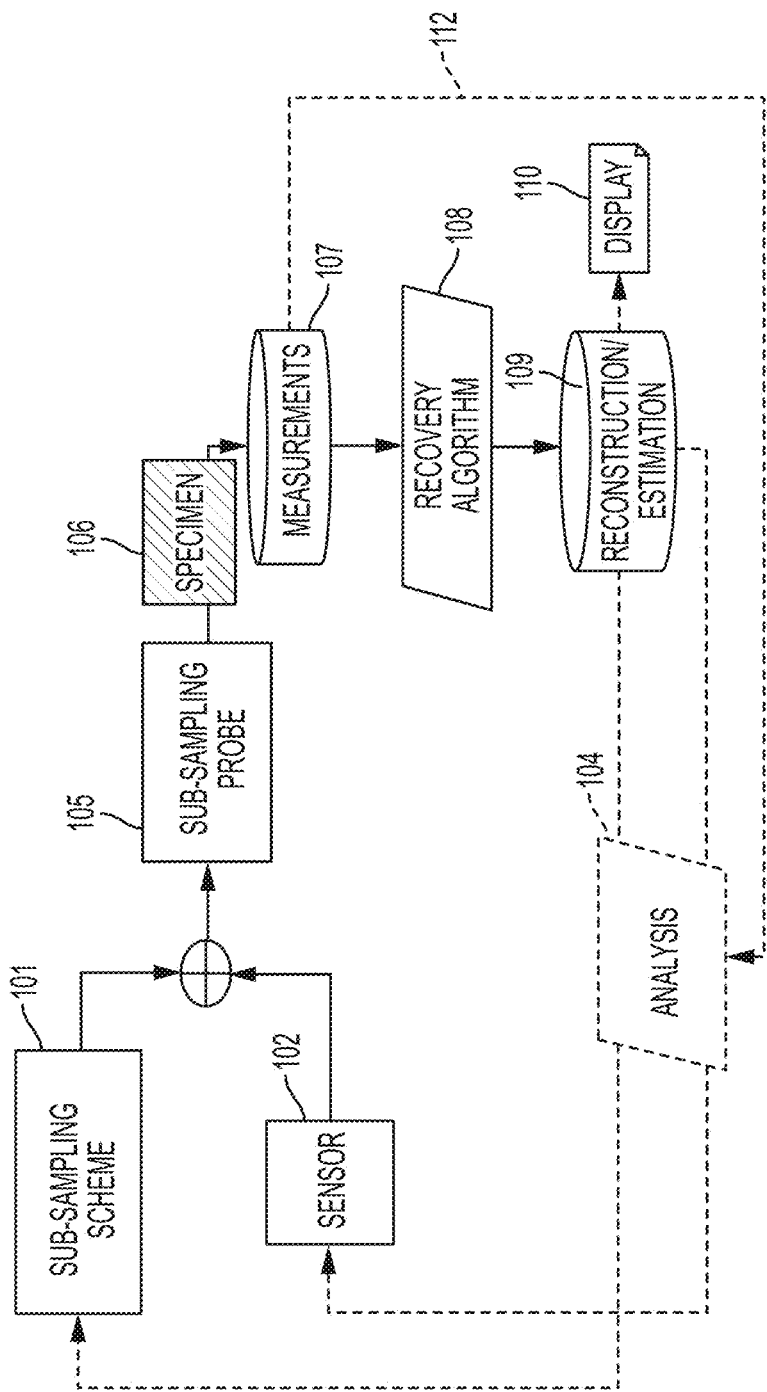
FIG. 1 is an schematic chart representing one embodiment of sensing conditions of an electron microscope system and/or analytical probe, a specimen analyzed thereby, or both.

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, densities, volumes, intensities, percentages, electron doses, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

Computational imaging techniques can enable significant reductions in destructive observer effects and in acquisition times on specimens analyzed by analytical instruments such as microscopes and spectrometers. The premise is that useful information regarding a specimen can be well represented in a much sparser form using a suitable basis set, and that this suitable basis set can be fully recovered from significantly fewer measurements than conventional "pixel-by-pixel," full-sampling acquisitions (hence reducing the observer effects). For example, in analytical instruments utilizing an electron beam probe, a full micrograph reconstructed from a sparse data set acquired by sub-sampling a specimen (compared to full pixel-by-pixel sampling) can be obtained using a shorter acquisition time and/or a lower dose (i.e., a lower exposure of the specimen to the electron beam). The result is an image that is substantially equivalent to one produced from fully sampling the specimen but that is obtained more efficiently and with minimal electron-beam damage to the specimen.

Traditionally, an image is generated prior to qualitative and/or quantitative analysis because a maximum resolution image can be directly displayed based on a full dataset from full, pixel-by-pixel sampling of the specimen and because the image is subsequently used as an important source from which instrument parameters and specimen characteristics can be extracted. This is often true even in cases where a high resolution, complete image is not the desired final result or piece of information. However, in contrast to conventional, pixel-by-pixel, full sampling, generating the complete image from the sparse dataset resulting from sub-sampling a specimen is computationally much more complex. Reconstructing a complete image from a sparse dataset can require increased processing time and burden due to the application of computational imaging techniques to the sparse dataset. In one example, the volume and velocity of the data produced by electron microscope experiments can pose a processing challenge. In particular, at least one grayscale image composed of at least 1,000,000 pixels is produced every second. Sub-sampling the specimen results in images with much fewer pixels, e.g. 100,000, but these incomplete, sub-sampled images are produced at a faster rate, which compounds the velocity issue. Therefore, embodiments described herein can be used to analyze incomplete data of high volume and velocity. Furthermore, in certain embodiments, the reduction in data transfer rate is related to the reduction in sampling measurements. For example, 10% sub-sampling can result in a data transfer rate that is 10% of that of full-sampling.

Furthermore, an incomplete, sub-sampled image based on a sparse dataset does not provide sufficient information to be readily interpretable or actionable by an operator of the analytical instrument. Contrary to many existing electron microscope systems and operation of the same, the inventors have determined that estimation of many instrument parameters and specimen characteristics from a sparse dataset can be performed independent of image reconstruction. Accordingly, embodiments for sensing conditions of an electron microscope system, a specimen analyzed thereby, or both are disclosed. The embodiments comprise estimation of instrument parameters, specimen characteristics, or both based on a sparse dataset acquired from an electron beam probe sub-sampling a specimen. Accordingly, estimation can occur based on sparse datasets and prior to, during, after, or absent processing of the sparse dataset using computational imaging techniques.

In some instances, computational imaging techniques, including compressive sensing and inpainting, can introduce artefacts in reconstructed micrograph images. With or without artefacts, the reconstructed image can lead to errors in estimation of the instrument parameters, specimen characteristics, or both. In such instances, embodiments disclosed herein can provide faster and/or better estimations. Furthermore, efficiency can be improved because sampling and image reconstruction can be withheld until analytics from the estimation described herein indicates that the situation and/or results are appropriate. Total electron dose delivered to the sample, total acquisition time, and observer effects can all be minimized. Further still, the sub-sampling sensing scheme can be optimized by altering the scan pattern to provide the desired results, whether those results are images, specimen characteristics, instrument parameters, or combinations thereof. Accordingly, in some embodiments, the estimation of instrument parameters, specimen characteristics, or both can be performed prior to reconstruction of a micrograph image, at substantially the same time (i.e., in real-time) as image reconstruction, or even without image reconstruction. In one embodiment, image reconstruction is guided by the instrument parameters, the specimen characteristics, or both.

FIG. 1 is a flow diagram illustrating one embodiment disclosed herein. A sub-sampling analytical probe 105, as used herein, can refer to a sub-sampling scheme 101 and a sensor 102 configured to sub-sample a specimen. Non-limiting examples of a sensor can comprise an electron beam probe in an electron microscope system. Examples of detectors for electron microscope systems can include, but are not limited to bright field STEM, annular STEM, pixelated, and spectral detectors. The detectors can be above or below the specimen. In other analytical instruments the sensor can comprise a charged particle beam (e.g., a SIMS instrument), a neutral particle beam, an electromagnetic beam (e.g., an optical microscope, an X-ray spectrometer, or an optical spectrometer), and/or a physical tip (e.g. an AFM instrument). Non-limiting examples of measurement schemes include line-hop random scans, jittered random scans, line-by-line raster scans, scans having beam-blanking, scans having masks to sub-sample the specimen, and combinations thereof. Sub-sampling of the specimen 106 can provide measurements 107 composing a sparse dataset.

In certain embodiments, the measurements 107 of the sparse dataset are directly provided 112 for analysis 104. Analysis based on the sparse dataset can occur independent from, or in conjunction with, image reconstruction 109. Unlike traditional approaches, analysis 104 is not necessarily based on complete images produced by either full sampling or by reconstruction of a complete image from sparse datasets using a recovery algorithm 108.

The analysis 104 performed based directly on sub-sampling measurements (i.e., sparse datasets) and/or independent of complete imagery can provide specimen characteristics and/or instrument parameters. Examples of instrument parameters can include, but are not limited to specimen tilt, instrument drift, drift velocity, and image focus. Examples of specimen characteristics can include, but are not limited to feature dimensions, composition, and frequency count of one or more features. Feature dimensions can refer to the size (e.g., length, height, width, radius, area, volume) of a feature related with the specimen. For example, a feature can include, but is not limited to a grain, a growth seed, a dendrite, a nanoparticle, nanowire, nanorod, and topographical objects of a specimen. In some embodiments, analysis of the sparse dataset(s) can comprise establishing a baseline state of the specimen and detecting changes in state compared to the baseline. Establishment of the baseline state and detection of changes therefrom can be facilitated by various computational and statistical techniques including, but not limited to, edge detection, Gaussian mixture regression, summary statistics, measures of spatial variability, entropy, matrix decomposition information and others disclosed elsewhere herein.

Image drift (drift velocity) can be calculated from the center of mass of the image (differences of centers of mass of a sequence of images). A sub-sampled image maintains this property and the center(s) of mass can be computed directly by replacing missing data with zeros, or by a statistical estimate taking the missing data into account. An out of focus image and a tilted (with respect to the beam) will cause measurable differences in the analytical probe intensities. For example a tilted image will have intensities at the edges that are inconsistent with the center. The optimal tilt/focus can be estimated from a set of acquired images with different tilts/foci. For these imaging metrics sub-sampling will have an associated error with respect to the actual metric. The minimal sampling level can be determined based on the desired accuracy for the metric and the capabilities of the analytical sensor.

In certain embodiments, the analysis 104 can provide results and/or information as feedback to the sensor 102 and/or the measurement scheme 101. Accordingly, an adjustment can be applied to the analytical instrument or a component thereof. In one example, during measurement of a specimen in an electron microscope, a sparse dataset can be analyzed for instrument focus. If the focus is not sharp, the microscope can be adjusted in real-time in response to a direct analysis of a sparse dataset independent of image reconstruction. Furthermore, the focus can be adjusted automatically in this manner without the necessity of operator input. The result is efficient operation, electron dose minimization, and reduction in acquisition time because fewer measurements are obtained in the sub-sampling scheme and because complex computational imaging processes are not applied.

The algorithms, computational techniques, and/or calculations described herein may be, for example, embodied as software or firmware instructions carried out by a digital computer and/or processing circuitry. For instance, any of the disclosed instrument parameter and specimen characterization estimation techniques, computational imaging techniques, and/or data analysis techniques can be performed by a computer or other computing hardware (e.g., an ASIC, FPGA, CPLD, processor, etc.) that is part of a sensor system and/or an analytical instrument. The sensor system can have interconnections and communications among an analytical probe, a detector, and/or an analytical instrument control system and can be programmed or configured to read a data storage medium and perform the desired estimation, imaging, and/or analysis computations (e.g., one or more of the estimation techniques disclosed herein). The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed estimation techniques. The results of the computations, including but not limited to sparse datasets, sparse images, and reconstructed complete images, can be stored (e.g., in a suitable data structure or lookup table) in the one or more tangible, non-transitory computer-readable storage media and/or can also be used by other software programs, communicated to an instrument control system, or output to the user, for example, by displaying, on a display device, data read from the data storage medium. The results that are stored or outputted can include, but are not limited to, images, micrographs, video, spectra, diffraction patterns, hyperspectral images, operational commands, instrument parameters, specimen characteristics, and combinations thereof.

To facilitate review of the various embodiments of the disclosure, the following explanations of specific terms are provided:

Definitions and Abbreviations

Complete image as used herein means an image resulting from full, pixel-by-pixel sampling or from computational imaging reconstruction.

STEM as used herein means scanning transmission electron microscope.

Movie as used herein means a series of still images, which when displayed on a visual medium creates an illusion of motion.

Serial acquisition, or serial mode referring to acquisition, as used herein means acquiring data in serial order at particular positions as the analytical probe traverses a scan region of the specimen along a scan path. At each sampling position along the scan path in a single scan, acquisition of a measured value is performed. In contrast, a parallel acquisition performs a plurality of acquisitions, wherein each acquisition encompasses an entirety of a scan region.

Streaming data as used herein means data that is generated at a particular rate. The data can comprise measurements sampled by an analytical probe and captured by a detector. The streaming data can be continuous over a given interval. It can also be streamed in a batch-wise manner.

Sub-sampling as used herein means using an analytical probe to sample a specimen at fewer acquired positions than the maximum possible. It can refer to acquiring measurements at a rate that is less than the full, pixel-by-pixel sampling rate of an analytical probe in an analytical instrument. In some embodiments, the sub-sampling rate is less than or equal to 80% of the full sampling rate. In certain embodiments, the sub-sampling rate is less than or equal to 50%, 40%, 33%, 30%, 25%, 20%, 15%, 10%, 8%, 5%, 3%, 2%, or 1% of the full sampling rate.

Sub-sampled image as used herein means a visual representation of a sparse dataset without the application of computational imaging techniques to generate a complete image.

Sparse dataset as used herein means at least one set of data values comprising measurements from a sub-sampled scan of a specimen.

EXAMPLES AND COMPARISONS

To further illustrate certain embodiments of the disclosed methods and systems for sensing conditions of an electron microscope instrument, a specimen analyzed thereby, or both, and to provide various comparative analyses and data, below are some Examples with comparison test data.

Real-Time Sensing of Microscope Conditions and of Li Growth

In one example, embodiments of the present invention are employed in a Real-time Event Detector for Sparely-sampled Images (REDSI) tool, which can provide microscopists with real-time data analysis support for their experiments. REDSI helps the microscopist steer a STEM experiment by providing them with specimen characteristics and with streaming feedback about how and where the specimen being imaged is changing. In the present example, REDSI is applied in a STEM instrument to monitor in real-time the formation and/or dissolution of lithium dendrites. A microscopist can be provided real-time information by embodiments of the methods and systems described in this example as the STEM experiment is taking place, thereby gaining insight into whether or not the experiment and data acquisition are proceeding as desired. For example, if the experiment is monitoring lithium growth, the microscopist can be alerted to the occurrence and location of events such as the beginning and ending of the growth period in near real-time as opposed to waiting for a full-sampling, pixel-by-pixel scan or for a reconstruction of a complete image from a sub-sampled scan. Embodiments described herein can also alert the microscopist if the specimen is leaving the field of view of the microscope, for instance, as a result of drift.

Instrument parameters and/or specimen characteristics can be provided by the electron microscope system to the user in an unsupervised fashion and in the absence of any preliminary information regarding the state of the microscope system and/or the specimen. Furthermore, the current example involves performing sensing of the specimen characteristics in a streaming context. Sub-sampling measurements are being provided as streaming sparse datasets. Algorithm 1 below is one example describing computation of a leverage value used to detect events in real-time using an expanding window baseline design. For each randomly, sub-sampled STEM image produced, p metrics are computed that relay information about the state of the image. As used herein, image can refer to a visual representation of a dataset. A sub-sampled image is a representation of a sparse dataset. A complete image is a representation of a full data set. Sparse datasets comprise sub-sampling measurements. Full datasets comprise pixel-by-pixel measurements. Referring to sub-sampled image 202 in FIG. 2 as an example, sub-sampled images are difficult for operators to directly interpret and can contain significant gaps with no measured values. A complete image 201 is shown for comparison in FIG. 2. The sub-sampled image is not necessarily one that has been reconstructed using computation imaging techniques such as compressive sensing and inpainting. Before events can be detected, a baseline set of b images is collected. Once the baseline is established, the distance between each subsequent image and the baseline set is quantified by its leverage $h_i$, which is the $i^{th}$ diagonal element of the so-called hat matrix, $H_i$. We compare each $h_i$ to a chosen threshold value c to determine a "leverage score". If $h_i < c$ the score indicates no event detected, while $h_i \geq c$ are scored as events. If $h_i < c$ then $x_i$ is added to the set of baseline images. Images found to be significantly different from the baseline, i.e. $h_i \geq c$, are excluded from future leverage calculations.

---

Algorithm 1: Computation of leverage to detect events in real time using an expanding window baseline design.

---

Data: Images $Z_i$ for i = 1, ..., n, baseline size b, threshold c
Result: Leverage value for each image $h_1, ..., h_n$
Begin data collection;
while Experiment proceeds do
| Compute p metrics on current image $Z_i$, $x_i \in R^p$;
| Append $x_i$ to a subset of previously computed metrics to
| form $X_i \in R^{n_i \times p}$;
| if $n_i \geq b$ then
| | Compute $H_i = X_i (X_i^T X_i)^{-1} X_i^T$;
| | Set $h_i = n_i (H_i)_{\{n_i, n_i\}}$, i.e., $n_i$ times the $n_i^{th}$ diagonal
| | element of $H_i$;
| | if $h_i > c$ then
| | | Remove $x_i$ from $X_i$
| | end
| end
end

---

Figure 3A:
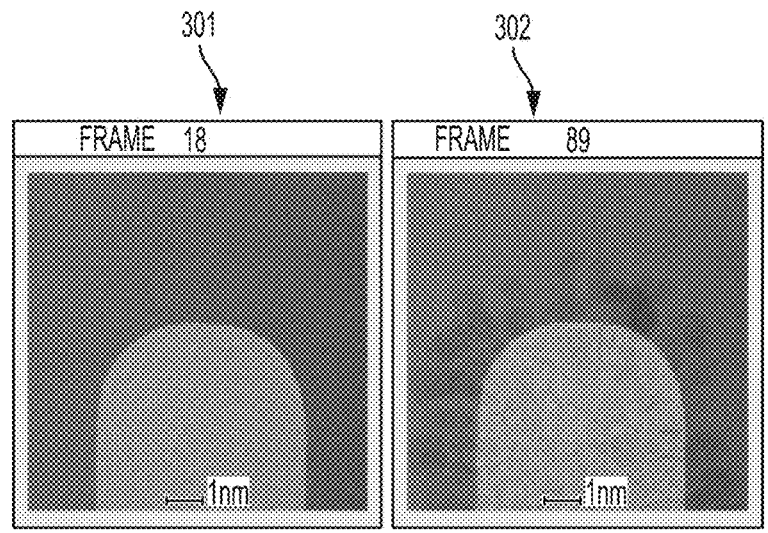
FIGS. 3A-3B represent a comparison between two states of a specimen during an electron microscope experiment.
Figure 3B:
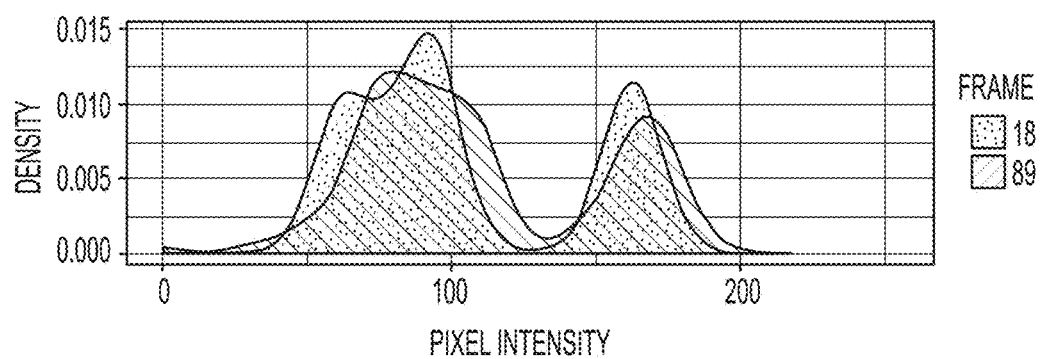

In implementing the algorithm above various metrics, threshold values, c, and the nature of the baseline set (including its size and the way in which the baseline is formed) were determined. Each image produced by an electron microscope is recorded as a text file containing three variables for each pixel sampled: an (x,y) co-ordinate pair and a grayscale intensity value. Referring to FIG. 3, images 301 and 302 from two example frames from an electron microscope experiment are given in FIG. 3A along with the corresponding pixel intensity distributions (FIG. 3B). According to the images themselves as well as the intensity distributions, it is clear the two images are quite different with respect to several characteristics.

Statistics, or metrics, can be used to capture the pixel intensity distribution's location (mean, mode, median) and scale (standard deviation, median absolute deviation, skewness). Standard location and scale metrics can be used, especially if other characteristics remain constant with respect to time. If several other characteristics of the images also appear to change through time other metrics can provide enhanced performance. Some examples include the strength of spatial dependence, the presence of image features and the number of modes present in the intensity distribution. In the present example, the following five metrics were demonstrated as examples.

Anode Height Estimation:

An obvious feature of the anode images is the anode itself. An edge detection algorithm is used to estimate the height of the anode in each frame. To do this, a threshold value is chosen to segment the image into foreground (anode) and background (electrolyte) classifications. A logistic regression model is fit to the foreground/background classifications where the covariate information used to model the probability of a pixel being on the anode is a polynomial of the x-coordinate of that pixel. The height of the anode is estimated to be the largest y value that is predicted to belong to the anode.

Proportion of Growth/Number of Particles:

A second feature present in the later half of the anode videos is the growth of lithium. More generally, pixel intensities can be classified into categories corresponding to material growth or nanoparticle nucleation. As the pixels are classified on a randomly sampled image, one can assume that the proportion of pixels classified as growth or particle to those classified as "background" or not growth or particle, generalizes to the fully sampled image. Image analysis techniques can be used for the classification of pixel intensities. For example, a Gaussian mixture regression model (GMRM) can distinguish between growth or particle and background. A post-hoc spatio-temporal correction can then be used to remove residual noise. The algorithm below summarizes GMRM.

---

Algorithm 2: Estimation of Li growth using GMRM.

---

Data: Randomly sampled images $Z_i$
Result: Li growth estimation for each randomly sampled
  image
Begin data collection;
while Experiment proceeds do
| for Each image do
| | Estimate the GMRM using Expectation Maximization;
| | Cluster pixels into one of K components;
| | Determine which component belongs to the
| | background pixels based on a reference region;
| | Classify each component as foreground or
| | background;
| | Identify pixels classified as "Growth";
| end
| Remove noise with a post-hoc spatio-temporal correction;
| Count proportion of pixels classified as "Growth";
end

---

Unimodality Test Statistic:

The Hartigans' dip test statistic for unimodality using the R package diptest was calculated. This statistic can quantify the amount of evidence against the null hypothesis that the distribution of pixel intensities is unimodal. If the distance between modes in pixel intensity distribution changes, particularly if it decreases, this indicates that the intensity distribution has changed substantially. If the intensities already exhibit a bimodal distribution, see frame 18 (301) in FIG. 3A, then the dip statistic will decrease as the intensity distribution's modes move closer to one another, see frame 89 (302) of FIG. 3A.

Standard Deviation:

The standard deviation of the pixel intensities across the randomly sampled image was calculated. Unlike the mean of the pixel intensity distribution, the standard deviation of the pixel intensities will likely change when different processes occur. That is, a change in the standard deviation of intensities would indicate the presence or absence of something in each frame.

Moran's I:

Using the R package ape, Moran's I autocorrelation coefficient on pixel intensities was calculated. Moran's I can be used to determine whether any of the pixels are spatially correlated with each other. The values for this metric range between −1 and 1. Moran's I can be used to identify particle growth as it affects the spatial characteristics of the specimen. Images early in the anode video (frame 18 in FIG. 3A) exhibit strong spatial correlation because the white light and dark pixels are tightly grouped next to one another. As Li growth develops, however, (frame 89 of FIG. 3A) the spatial correlation decreases as dark pixels appear manifest next to light and less dark pixels. Thus, the Moran's I statistic can help to identify when the video is changing with respect to the spatial characteristics of the process.

Figure 4:
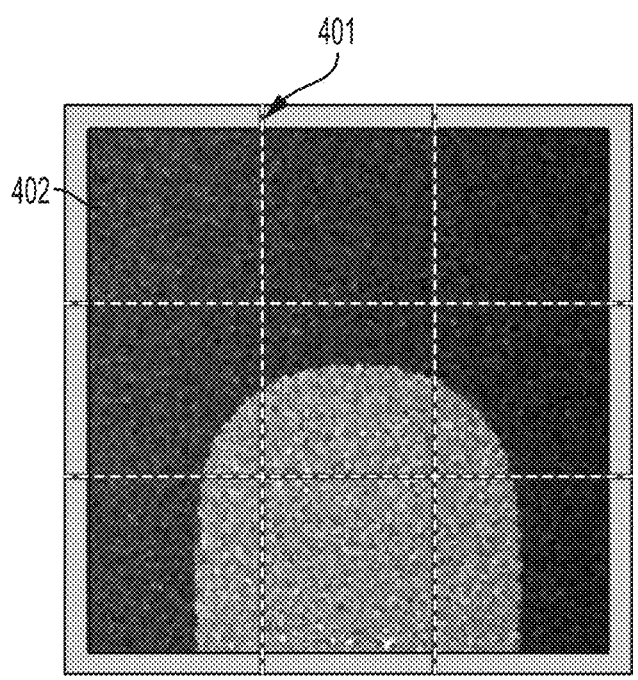
FIG. 4 is an image representing an example of using a grid to incorporate spatial information when sensing conditions of a specimen, electron microscope, or both.

According to some embodiments, a baseline set against which all future images will be compared against is defined. Algorithm 1 (above) uses an expanding window, that is, the baseline grows to incorporate images similar to those already in the baseline. Other baseline options can include a static baseline and a moving window baseline. A static baseline can be considered to be a case of the expanding window where no new frames are added to the initial baseline set of images. In certain embodiments, an initial baseline is grown using an expanded window to provide the algorithm opportunity to identify subtle changes. A moving window baseline can provide frame-to-frame changes in the experiment REDSI, as an embodiment of the present invention, is capable of identifying when an event is taking place in streaming data (i.e., video). In some embodiments, it is also capable of conveying to the microscopist where events are localized. In addition to an overall leverage score, a grid 401 can be applied to convey spatial information to the microscopist. The grid can be created by dividing the randomly sampled image into $n_g$ cells 402 as shown in FIG. 4 with $n_g=9$. Algorithm 1 is applied to each cell independently using the same p chosen metrics to compute $h_l$ for l=1, . . . , $n_g$ grid cells.

REDSI was tested on a previously conducted in-situ lithium battery experiment. The experiment tracked the life cycle of a lithium anode during a charge and discharge cycle. As the anode charged, Li metal dendrites formed and affected the cycling performance. Scientists hoped to both quantify the rate and location of Li growth during the experiment. The microscopist who ran the experiment also needed to know whether or not the node has drifted out of the field of view.

Figure 2:
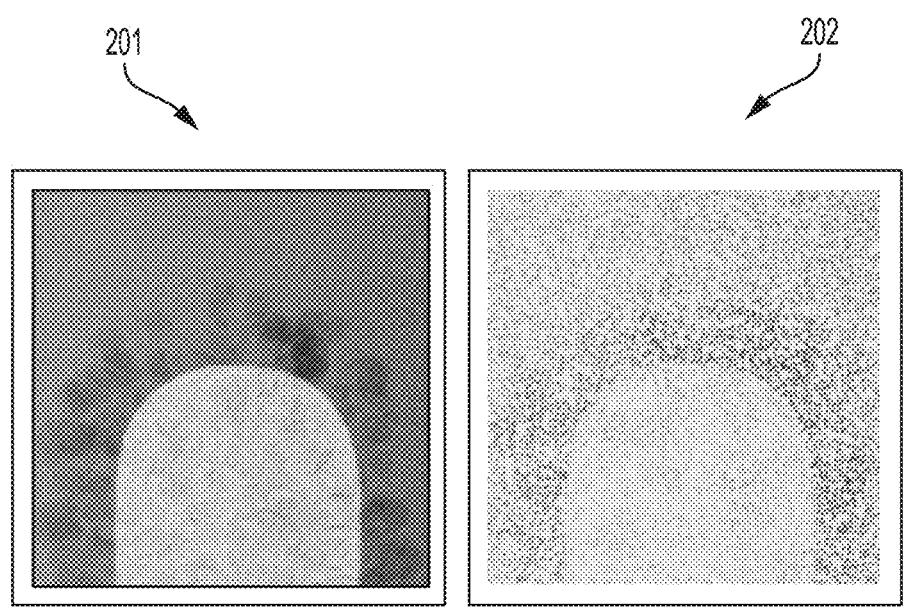
FIG. 2 includes complete and sub-sampled (5% sub-sampling) high-angle annular dark field (HAADF) images from a scanning transmission electron microscope experiment of lithium dendrite growth.

The charging/discharging experiments were captured using a STEM that produced a series of high-angle angular dark field (HAADF) images. The STEM used a mass-thickness contrast, which resulted in greyscale pixels ranging in intensity value between 0 and 255. In the dark-field images, the darkest material is the least dense. As dendrites are not dense relative to the anode, Li growth appears as darkly colored pixels as seen in FIG. 2.

REDSI identified not only when an event was taking place in the video, but also where events were localized. In addition to calculating the overall leverage score, the randomly sampled image was divided into $n_g$ cells as shown in FIG. 4 with $n_g=9$. Algorithm 1 is applied to each cell independently using the same p chosen metrics to compute $h_l$ for l=1, . . . , $n_g$ grid cells. Accordingly, the microscopist was informed automatically when and where the randomly sampled image changed significantly and was provided an estimate of the rate of Li growth in real or near-real time. The original data for these experiments were fully sampled. The results described herein were obtained by simulating a sub-sampled STEM image by randomly sampling to 5% of the full dataset. In practice, a STEM instrument would only scan a random subset of pixels (i.e., sub-sampling a specimen) and the full image would not be available without computational imaging techniques being applied to reconstruct such a full image. A data stream was also simulated by populating a directory every second with a single frame text file containing coordinates and intensity values.

Figure 5:
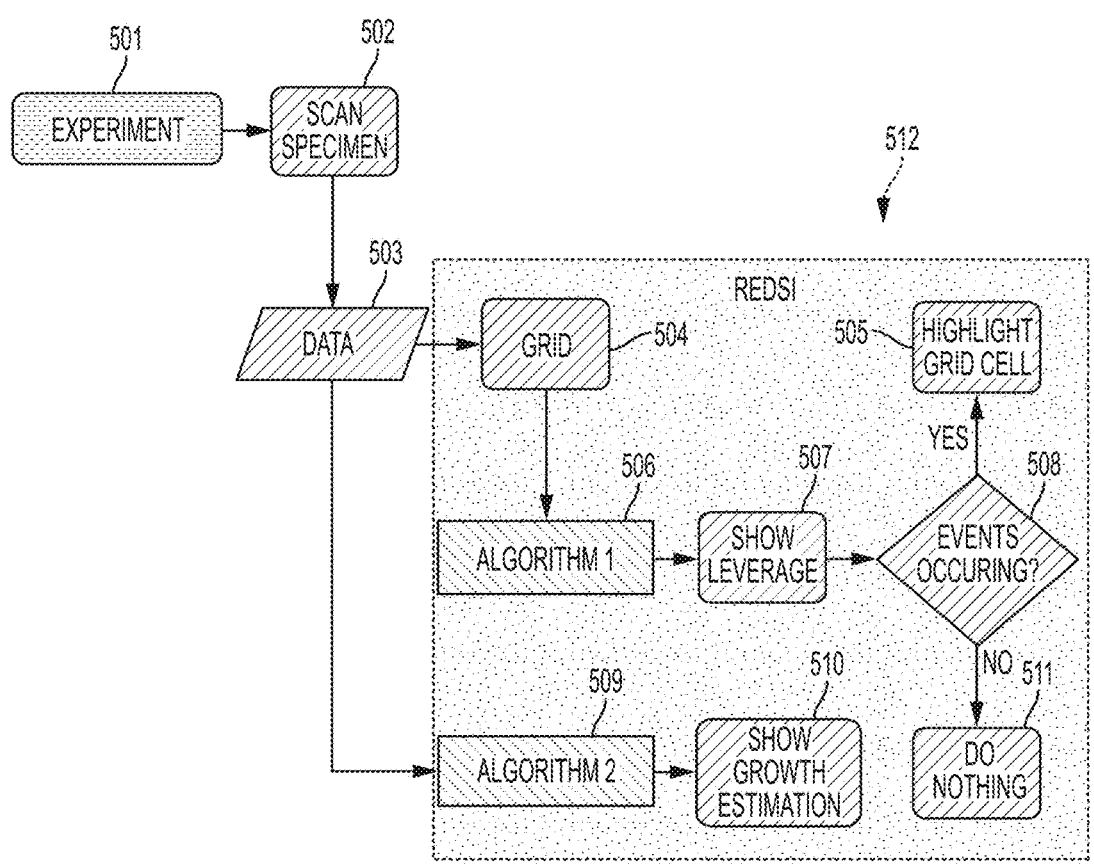
FIG. 5 is a chart representing one embodiment (e.g., REDSI) for real-time sensing of conditions of a specimen, an electron microscope, or both.

The REDSI process during simulated live experiments is shown in FIG. 5. During an experiment, a specimen is scanned according to a sub-sampling scheme. The data from the sub-sampling scans are analyzed according to REDSI 512. A grid 504 can be applied to provide spatial information regarding detected events. Algorithm 1 506 is used to compute a leverage score, which can be shown 507 to an operator. If events are occurring according to the leverage score, the grid cell in which the event occurs can be highlighted 505 according to an indicator or cue as described elsewhere herein. Otherwise, no action is taken 511. For direct growth estimation 510, algorithm 2 can be applied 509. In the present example, Algorithm 1 and Algorithm 2 components were implemented in the C++ language using the R package, Rcpp.

Figure 6A:
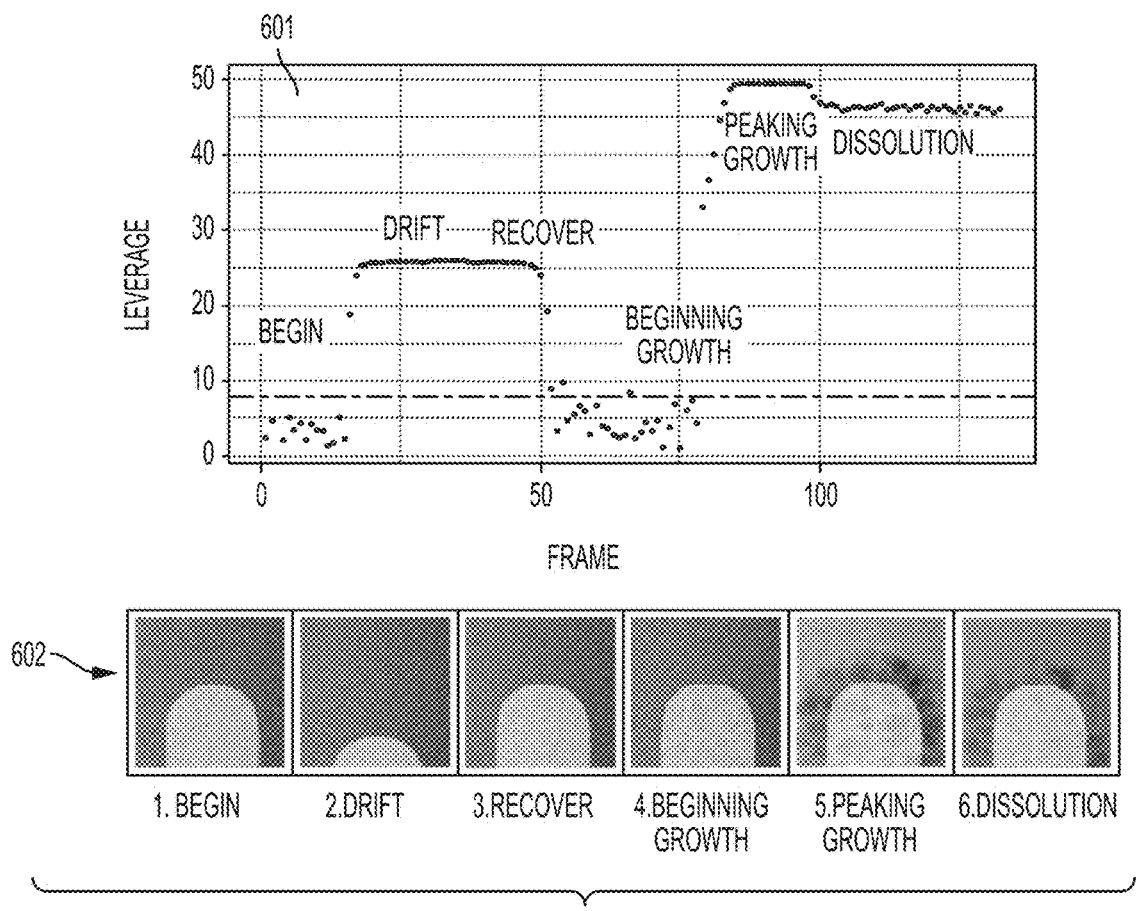
FIGS. 6A and 6B contain charts and images showing successful detection and estimation of sensed conditions during an in-situ lithium deposition/dissolution experiment.

A plot of the leverage values computed using REDSI for this experiment are shown in FIG. 6A. The leverage score from each new frame is plotted 601 in sequence so that a new frame populates a new leverage score downstream from the previous scores. FIG. 6A also shows a sequence of frames 602 corresponding to the STEM images at significant time points.

At Interest Point 1, one of the images used for determining the baseline can be seen. a baseline size of 10 was selected. In other words, $n_b=10$, which is a relatively small $n_b$.

As shown in Interest Point 2, the microscope has drifted and the anode begins to move out of frame. The leverage increases above the chosen cutoff value c=8. This increase in leverage indicates to the microscopist that the frame is significantly different from the baseline in some way. Here, the increase is a direct result of microscope drift.

At Interest Point 3, the drift has corrected the leverage decreases as expected, indicating that the images are more similar to the baseline set of images.

At Interest Point 4, Li growth is beginning. Though barely visible, the leverage starts to increase not because of drift but because of new intensity in the pixels associated with growth. As growth happens quickly, the leverage increases quickly.

At Interest Point 5, the Li growth peaks, and the leverage score decreases.

At Interest Point 6, there is a slight decrease in leverage. The corresponding image shows dissolution of the Li dendrites, which will remain in the image as "dead Li" that eventually detaches from the anode. The dendrites shrink in the dissolution phase, which caused the slight decrease in leverage.

Figure 7:
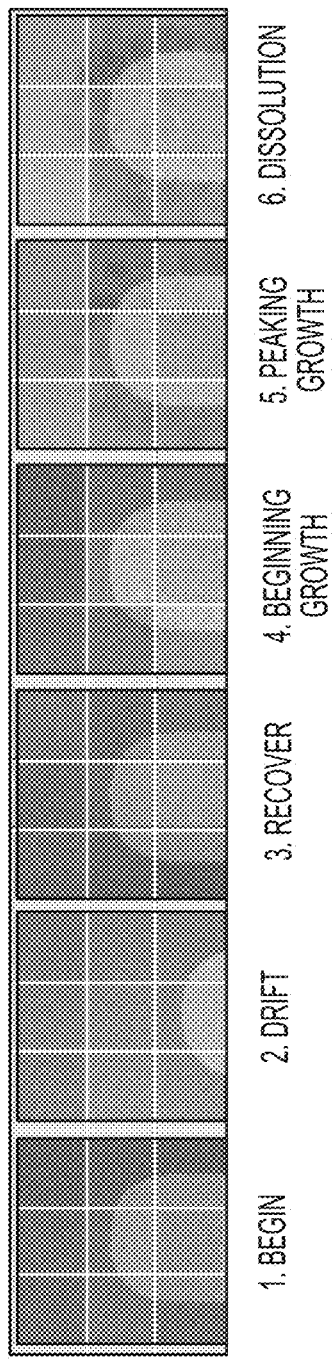
FIG. 7 contains a series of images at various interest points during the in-situ lithium deposition/dissolution experiment and include spatial information according to embodiments disclosed herein. The relative tone, which represents the hue of yellow in a color image) is a cue indicating locations in which the state is different than the baseline. The brighter hue corresponds to greater difference from the baseline state.

FIG. 7 shows the same series of images as in FIG. 6A, but includes localization information based on the applied grid. The brightness of the tone (which represents the hue of yellow in a color image) of each cell indicates how abnormal that cell is compared to that cell in the baseline images. None of the cells are colored yellow (i.e., all cells have a roughly similar tone) during the "Begin" and "Recover" phases because no events are taking place in any of the grid cells. The bottom two rows of cells are the brightest during the "Drift" phase because the anode is moving around in those cells the most. The cells surrounding the anode during the "Beginning Growth" phase are beginning to turn yellow (i.e., lighten in tone) because the growth starts around the anode first. Finally, the entire image except the cell contained entirely in the anode is bright yellow (i.e., light in tone) during the "Peaking Growth" and "Dissolution" phases as the Li growth has spread to all cells of the image except for the one contained within the anode. Other embodiments can utilize alternative cues to represent localization information. Examples can include, but are not limited to color contrast, patterns, numeric mappings or representations, grayscale contrast, and cell box outlines.

Figure 6B:
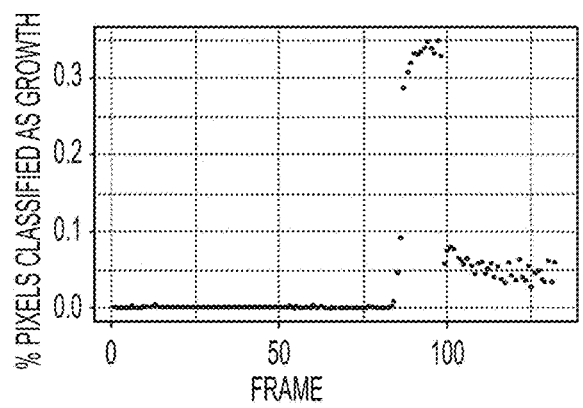

To estimate the volume of Li growth during the experiment the GMRM summarized in Algorithm 2 and elsewhere herein was used. A regression-based approach is inherent in this model and is in lieu of simple thresholding or clustering. This helps account for the global trend in gray scale values as seen from left to right in FIG. 2. The results from the experiment are shown in FIG. 6B. We observe no growth in the beginning of the experiment, even in spite of microscope drift. The GMRM begins to classify pixels as growth shortly after the leverage begins to detect growth, near frame 80 as seen in FIG. 6A.

Gaussian Mixture of Regressions Model and Sensing Conditions from Sparse Datasets In the present example, a Gaussian mixture of regressions model (GMRM) is used to extract quantitative information from a sparse dataset, bypassing the necessity to first reconstruct the images by computational imaging techniques. The sparse dataset, i.e. sub-sampled images where not all the pixels in the image were illuminated with the electron beam, was obtained by sub-sampling a Li battery during charge/discharge cycles. The deposition and dissolution of Li at the anode were accurately quantified for sub-sampling levels down to 1%. Performing operando imaging using a small fraction of the pixels allowed observations to be made while significantly reducing observer effects, increasing the imaging speed, and decreasing the total data transfer rate required.

In order to estimate instrument parameters and specimen characteristics, from the sparse datasets, STEM images were segmented into simple representations of the structures and processes within. Quantification methods can segment images by modeling the pixel intensities with a superposition of Gaussian peaks and use maximum likelihood to estimate the unknown structure parameters. In some instances, these methods aim to reduce the dose via an energy filtered mode. Other approaches to quantifying in-situ images can use thresholding techniques or physical models. In some embodiments, the method described herein can be used to routinely analyze sub-sampled images in real-time, or near-real-time.

Figure 8:
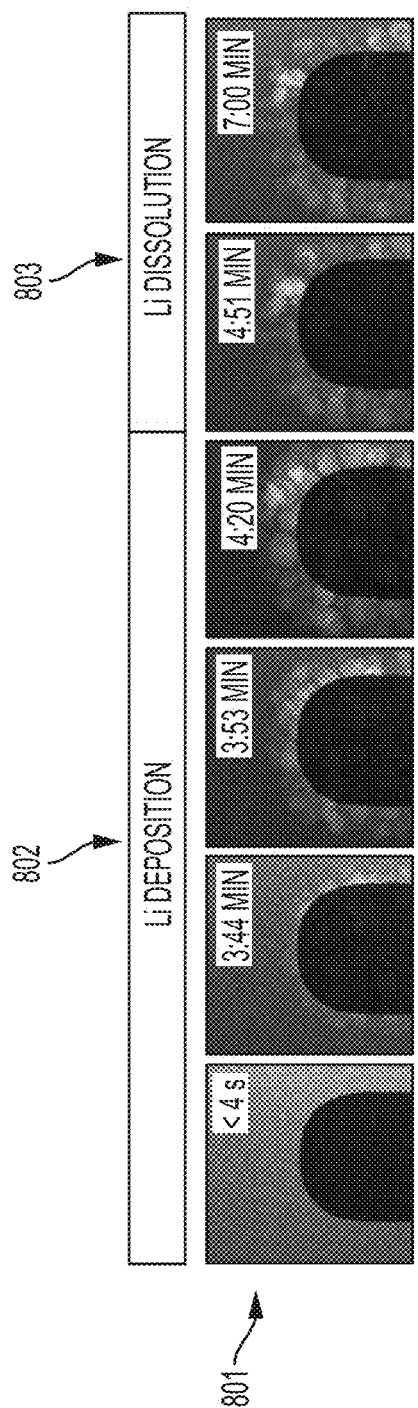
FIG. 8 contains a series of HAADF images of a lithium deposition/dissolution experiment. The dark area in each image corresponds to an anode. The light areas correspond to deposited lithium.

FIG. 8 includes a series of frames 801 from a movie while a Li-battery electrolyte was subjected to a CV scan. The movie comprises complete images acquired by full pixel-by-pixel sampling. In the movie, the electrolyte breaks down during the "charging" of the battery and Li is seen to be depositing 802 on the anode. When the voltage is reversed and the battery is "discharging," Li goes back into the solution 803. However, after completion of the cycle Li still remains on the anode indicating that the process is not 100% Coulombic efficient and that Li dendrites will form in the system upon repeated cycling. The bright field images shown in FIG. 8 were obtained from a STEM operating in mass-thickness contrast mode where each pixel is on a greyscale with values from 0 to 255. In this set of images, the Li is the least dense component of the system and therefore shows up as the brightest part of the image (the contrast is reversed from the Pt anode which is the hemispherical dark feature in the image). Therefore, the colors in each image can be classified as "white" Li, "black" Pt or "gray" electrolyte.

The algorithms used herein can segment a sequence of images into Li growth, Pt anode, or electrolyte and are able to handle image characteristics such as the spatial trends in each image that change from image-to-image, and the random noise within each image. These features are quantified using GMRM with a simultaneous background correction. A GMRM can be fit to the raw data that partitions the pixels into distinct clusters while simultaneously accounting for spatial trends in intensity. The clusters can be given feature labels based on image and cluster information. A spatio-temporal correction can be applied to the labels to account for noise. The final pixel labels can be used to quantify important information about the experiment.

Figure 9A:
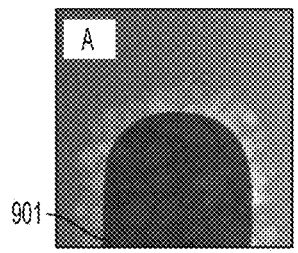
FIGS. 9A-9G includes images and graphs from a lithium deposition/dissolution experiment.

In analyzing the movie, each image (i.e., frame) is segmented based on its pixel intensity distribution. To do this, the distribution of intensities across the image can be assumed to be multi-modal where each mode is associated with a different feature. The background trend, which is often exhibited in STEM images (see FIG. 9C), was accounted for in order to accurately extract quantitative information about Li deposition/dissolution. Image segmentation methods based on standard Gaussian mixture models (GMMs) or thresholding can be applied. Other models can perform better when trends are present because the background intensities are a functional rather than static form. A GMRM can account for systematic trends in background, where a GMRM is an extension of a GMM with a regression-based approach. Let $z=(z_1, \ldots, z_n)^T$ represent the vector of n pixel intensities in the frame, and C be an n×K matrix of indicator variables that identifies which cluster into which each pixel belongs. That is, if k=3 then $C_{i,1}=1$ if pixel i belongs to class 1 while $C_{i,2}=C_{i,3}=0$. Then the distribution of pixel intensities is described by the likelihood $$p(z_i | \theta) = \prod_{i=1}^{n} \prod_{k=1}^{K} \left[ p_k N\left(z_i; \delta_k + \sum_{j=1}^{q} \beta_j f_j(x_i, y_i), \sigma_k\right) \right]^{C_{ik}}$$

where $N(x; \mu, \sigma) = \exp[(x-\mu)^2/(2\sigma^2)]/(2\pi\sigma^2)^{1/2}$ defines the Gaussian distribution probability density function, K is the number of mixture components and $\theta=(p, \beta, \beta, \sigma)^T$ is a vector of unknown parameters. The trend in pixel intensities can be accounted for by a regression model with independent variables $f_j(x_i, y_i)$ for $j=1, \ldots, q$ where $(x_i, y_i)$ define the spatial location of pixel i in the image and $f_j(\cdot, \cdot)$ is a function of $(x_i, y_i)$ (see below). The q-dimensional vector of unknown regression coefficients is denoted $\beta=(\beta_1, \ldots, \beta_q)^T$. The K-dimensional parameter vectors that differentiate the clusters are $p=(p_1, \ldots, p_K)^T$, $\delta=(\delta_1, \ldots, \delta_K)^T$, and $\sigma=(\sigma_1, \ldots, \sigma_K)^T$ which represent the mixture component weights, intercepts, and standard deviations, respectively. Due to the global trend in grayscale values, a modified version of the Expectation-Maximization algorithm, called the Expectation/Conditional Maximization algorithm (ECM), was used to estimate the parameter vector and the cluster probabilities for each pixel. The image is segmented by assigning each pixel to the cluster that is estimated to be most probable according to the ECM algorithm.

Figure 9B:
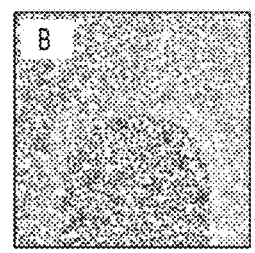
Figure 9C:
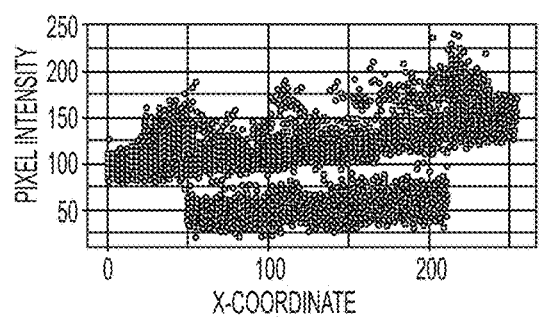

Possible forms of the background function $f_j(\bullet, \bullet)$ include a linear trend in the x direction, $f_j(x_i, y_i)=x_i$, quadratic trend in the x direction, $f_j(x_i, y_i)=x^2_i$, and similarly in the y-direction. If an anode 901 is in the video, referring to FIG. 9A, then the linear and quadratic trends in x will vary depending upon the y value implying interaction terms such as $f_j(x_i, y_i)=x_i y_i$ and $f_j(x_i, y_i)=x^2_i y_i$ will likely improve model performance. To determine the most appropriate intensity gradient function, several background functions were fit and model comparison techniques were used to determine the optimal model. The most appropriate form of the background trend in FIG. 9B is $\beta_1 x_i + \beta_2 x^2_i + \beta_3 y_i + \beta_4 x_i y_i$.

In addition to accounting for the images' background trend, the GMRM estimates the parameters associated with each of the clusters. In particular, a mixture of Gaussian distributions was used to model the distribution of detrended pixel intensities, which are defined by $z_i - \Sigma_{j=1}^{q} \beta_j f_j(x_i, y_i)$. The multimodal distribution of detrended pixel intensities in FIG. 9D correspond to K=4 Gaussian distributions with means, $\delta_k$, and standard deviations, $\sigma_k$, for k=1, ..., 4.

Figure 9D:
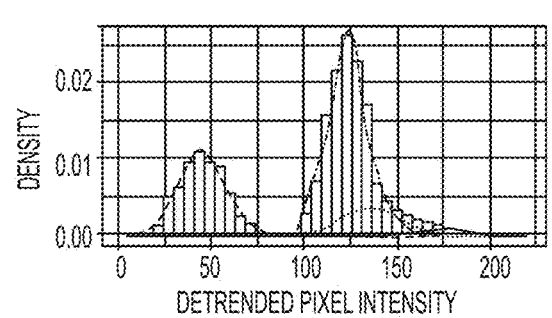
Figure 9E:
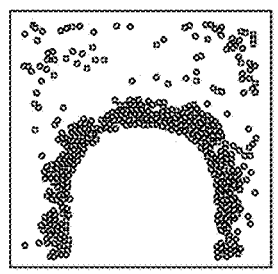

Once each pixel is clustered using the GMRM, the different clusters can be mapped to the image features: Li growth, Pt anode and electrolyte background. In FIG. 9A, the anode 901 is the darkest object in the image and is therefore represented by the cluster with the smallest intercept. The background clusters can be determined by identifying the most common cluster in a region of the image that is mostly background, e.g., a region in the upper left or right of the image. Let $\delta_b$ denote the intercept associated with the background cluster. The Li growth is the brightest feature of the image and will therefore correspond to the group(s) with the largest intercept value(s). That is, after the intercept values are ordered such that k>k' implies $\delta_k \geq \delta_{k'}$, then the Li growth cluster(s) are all clusters k such that $\delta_k > \delta_b$. The distributions in FIG. 9D are associated with the anode (dashed line, k=1), liquid electrolyte (dotted-dashed line, k=2) and two components for the Li-deposits (dotted line and solid line, k=3 and k=4 respectively). FIG. 9E is a plot of only pixels labelled as Li growth.

Figure 9F:
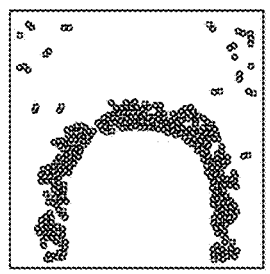
Figure 9G:
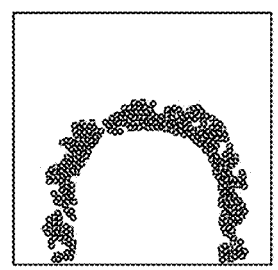

When noise is present in the STEM videos, the feature labels can often be improved by incorporating additional spatio-temporal information about each pixel. For example, spatio-temporal trends, beyond those already accounted for in the background, can be built into the GMRM. When doing so renders the GMRM too computationally expensive to perform in a timely manner, spatio-temporal coherence can be enforced by implementing a post hoc spatio-temporal correction on labeled pixels. To accomplish this, a spatio-temporal neighborhood is defined around each pixel and the proportion of pixels in that neighborhood belonging to each group is computed. If a pixel of interest is labeled differently from a given percentage of neighboring pixels, that label is changed to match its neighbors. That is, let $(x_i, y_i)_t$ denote the (x, y)-coordinate of the ith pixel at time t. Then the neighborhood for the ith pixel is defined by all pixels i' at time t'≤t such that $$d[(x_i, y_i)_t, (x_{i'}, y_{i'})_{t'}] \leq c$$

where $d(\bullet, \bullet)$ is a distance function and c is a chosen cutoff value. Specific examples of distance metrics are the $L_1$ and $L_2$ distances, which are of the form $|x_i - x_{i'}| + |y_i - y_{i'}| + |t_i - t_{i'}| \leq c$ and $(x_i - x_{i'})^2 + (y_i - y_{i'})^2 + (t_i - t_{i'})^2 \leq c^2$, respectively. The effect of spatio-temporal correction on the image data stream is shown in FIG. 9E (no correction), FIG. 9F (weak correction) and FIG. 9G (strong correction). Once the data stream is classified in this way, any number of quantitative features can be extracted based on pixel contrast.

Figure 10:
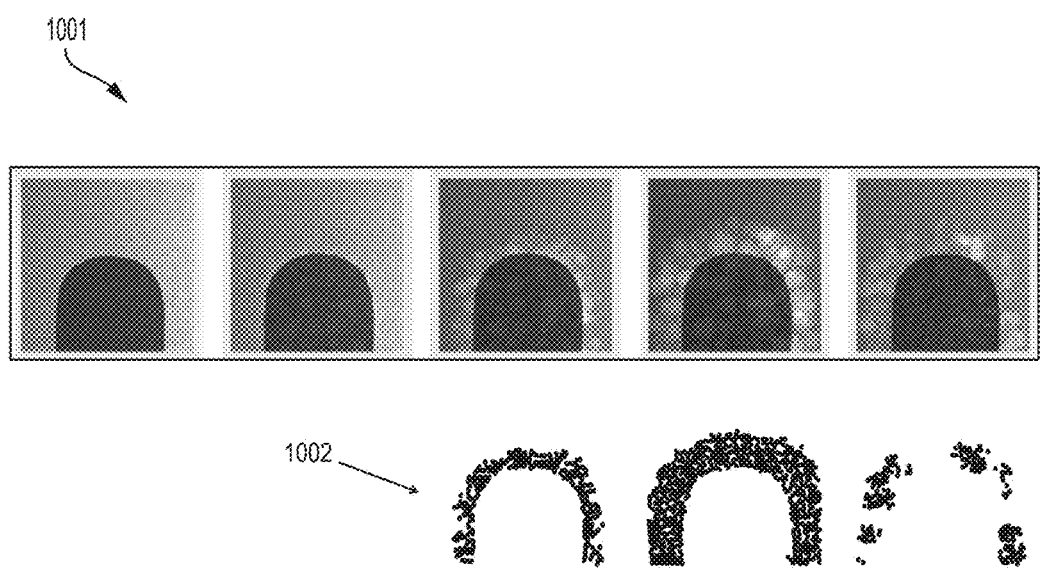
FIG. 10 contains a series of complete images (top row) during a lithium deposition/dissolution experiment and a series of images showing only pixels where lithium growth is sensed (i.e., estimated) based on a 10% sub-sampling.

Because the experiment that produced the movie comprised fully sampled images, the effect of sub-sampling can be simulated by randomly sampling pixels in each frame of the movie. FIG. 10 contains a series of complete images 1001 during the lithium deposition/dissolution experiment as well as a series of down-sampled images 1002 that model sparse datasets sub-sampled at 10%. The sub-sampled images show only the pixels classified as Li dendrite formation based on the GMRM with K=4 components when only 10% of each frame is sampled. A spatio-temporal correction was applied with parameters r=20 and γ=0.25. Pixels are correctly classified as Li growth or not when the growth occurs around the anode.

To quantify the effect of sampling a fraction of the pixels in an image on estimating the volume of Li growth, the movie was analyzed several times at different sampling rates: 10%, 5% and 1%. To make the results derived from different sampling rates comparable, the number of times the video is analyzed, denoted B, for each sampling rate is chosen such that each pixel is expected to be sampled 10 times. For example, in the 1% sampling scheme, each pixel has a 1% chance of being chosen, thus the video is analyzed B=1000 times so that each pixel is expected to be sampled 1000×0.01=10 times. The number of replicates, B, for each sampling rate is reported in Table 1.

TABLE 1

Average (Avg.) bias and uncertainty bound width of the GMRM method for the different sampling rates considered. Bias was computed as the difference in the estimated volume using a subset of the pixels and the volume estimated using the full image. The width of the uncertainty bound was taken to be the difference in the $90^{th}$ and $10^{th}$ percentiles. Both quantities were averaged over the course of the experiment.

| Sampling Rate | Num. Replicates (B) | Avg. Bias ($m^3$) | Avg. Width ($m^3$) |
|---|---|---|---|
| 10% | 100 | 0.094 | 0.703 |
| 5% | 200 | 0.332 | 1.121 |
| 1% | 1,000 | 2.012 | 6.001 |

Figure 11A:
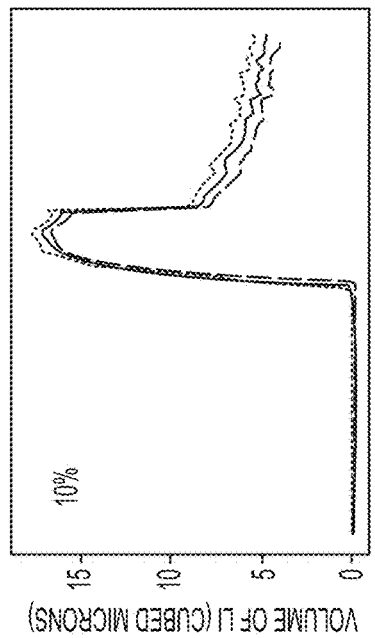
FIGS. 11A-11D contains graphs comparing estimated lithium volume at an electrode/electrolyte interface as a function of time during a lithium deposition/dissolution experiment. The graphs compare results for full sampling, and modeled 10%, 5%, and 1% sub-samplings.

FIG. 11A is a plot of the average of the B growth curves for each of the sampling rates along with the growth curve estimated using 100% of the sampled pixels. As such, the disparity between each of the growth curves for the different sampling rates and that of the 100% curve represents the bias introduced by subsampling. Additionally, the bias for each method averaged over the course of the experiment is reported in Table 1. The bias and sampling rates are inversely related.

Figure 11B:
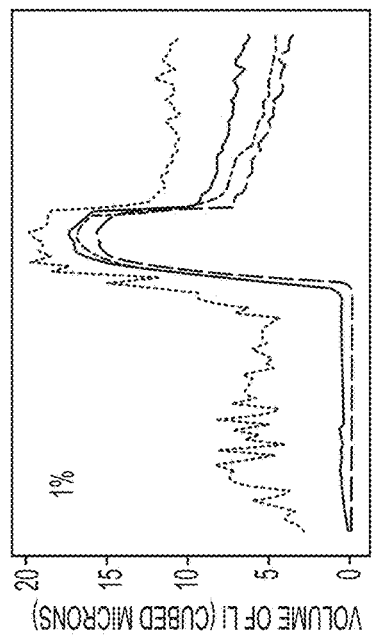
Figure 11C:
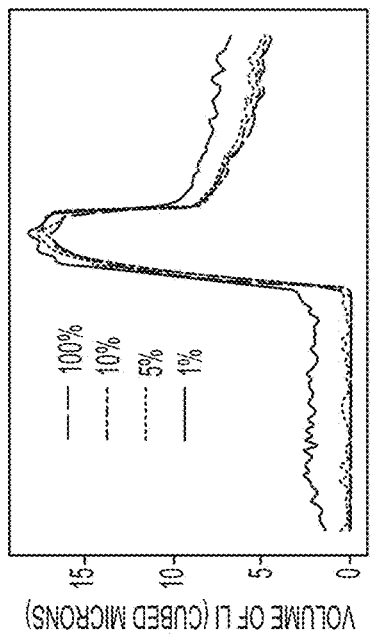
Figure 11D:
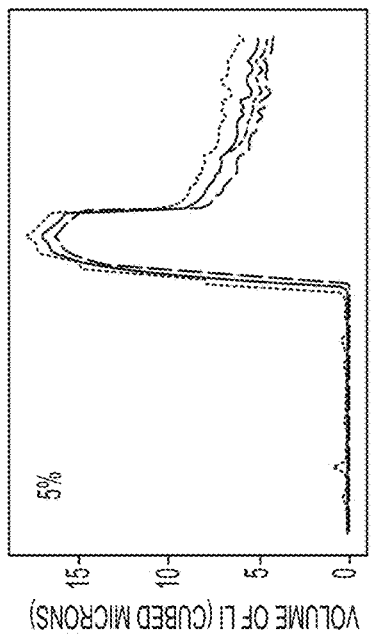

The uncertainty induced by the different random sampling schemes is illustrated in FIGS. 11B, 11C and 11D, in which the 10th (long-dashes line), $50^{th}$ (solid black) and $90^{th}$ (dotted line) percentiles of the repeated growth curves at different sampling rates are plotted along with the growth curve estimated using 100% of the pixels (dashed black line). Therefore, there is an 80% chance that if this experiment were analyzed again at a specified sampling rate, the resultant growth curve would lie between the two red lines in the respective figure. For all sampling rates, the 100% sampled growth curve (short-dashes line) is contained within the uncertainty bands throughout the course of the experiment. The widths of the uncertainty bands for the different sampling rates are reported in Table 1. The uncertainty bands widen as the sampling rate decreases with a significant decrease in uncertainty when the sampling rate is increased from 1% to 5%.

Drift Detection

Figure 12:
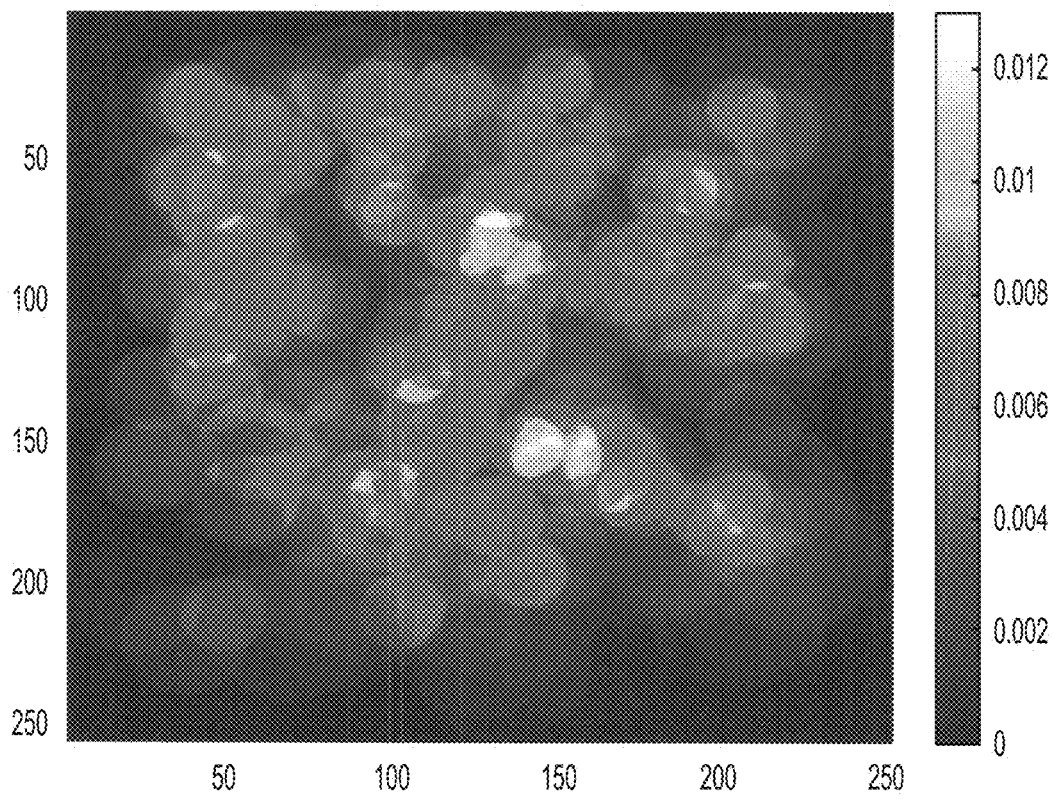
FIG. 12 is an image representing pixel intensities over a region of the specimen used for drift detection according to embodiment disclosed herein.

Referring to FIG. 12, one example of detecting drift according to embodiments described herein is disclosed. Two image frames exhibiting drift effects relative to one another are extracted from a complete STEM image with the top left corner of each image frame being (10,3) pixels apart in (x,y)-coordinates. According to some embodiments, the difference of the centroid positions of each image comprises a metric and/or estimator of drift. According to Table 2 below, for 1000 different subsampling masks we obtain the following root mean square error (RMSE) for the estimated drift at several different fractions of the pixels. For example, at 6% sampling we can expect to mis-estimate the drift by 3 pixels.

TABLE 2

Regarding drift detection in FIG. 12, root mean square errors in x and y directions for fractions of pixels.

| | Fraction | | | | | |
|---|---|---|---|---|---|---|
| 1 | 0.5 | 0.25 | 0.12 | 0.06 | 0.03 | 0.01 |
| RMSE x 0.0049898 | 0.67865 | 1.1738 | 1.7634 | 2.5978 | 3.714 | 6.1396 |
| RMSE y 0.33467 | 0.80003 | 1.1768 | 1.9186 | 2.6879 | 3.9134 | 6.3355 |

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A method for sensing conditions of an electron microscope system, a specimen analyzed thereby, or both, the method comprising:
   acquiring a sparse dataset from a sub-sampling of the specimen by an electron beam probe of the electron microscope system;
   determining directly from the sparse dataset a baseline state of the specimen, the electron microscope system, or both, wherein the baseline state is based on a plurality of metrics;
   quantifying distances of subsequent states of the specimen, the electron microscope, or both from the baseline state, wherein subsequent states are determined directly from subsequent sparse datasets;
   comparing the subsequent states to the baseline state; and
   estimating instrument parameters, specimen characteristics, or both according to said comparing.

2. The method of claim 1, further comprising applying an adjustment to an electron microscope system component after said estimating step, the adjustment associated with the instrument parameters, the specimen characteristics, or both.

3. The method of claim 1, wherein the specimen characteristic is one of feature dimension, composition, and frequency count of one or more features.

4. The method of claim 1, wherein the instrument parameter is one of specimen tilt, instrument drift, drift velocity, and image focus.

5. The method of claim 1, wherein said estimating step further comprises estimating prior to computationally reconstructing an image of the specimen, or without computationally reconstructing an image of the specimen.

6. The method of claim 1, wherein said sparse data comprises streaming sparse data and said acquiring step further comprises acquiring in a continuous or batch-wise manner the streaming sparse data.

7. The method of claim 1, further comprising analyzing in an operando or in-situ manner the specimen in the electron microscope system.

8. The method of claim 7, wherein the specimen during said acquiring is changing.

9. A sensor system comprising:
   a detector configured to acquire a sparse dataset from an electron beam probe arranged to sub-sample a specimen; and
   processing circuitry coupled to the detector and configured to:
      determine directly from the sparse dataset a baseline state of the specimen, the electron microscope system, or both, wherein the baseline state is based on a plurality of metrics;
      quantify distances of subsequent states of the specimen, the electron microscope, or both from the baseline state, wherein the subsequent states are determined directly from subsequent sparse datasets;
      compare the subsequent states to the baseline state; and
      estimate instrument parameters, specimen characteristics, or both.

10. The system of claim 9, wherein the specimen characteristic is one of a feature dimension, a composition, and a frequency count of a feature.

11. The system of claim 9, wherein the instrument parameter is one of specimen tilt, instrument drift, drift velocity, and image focus.

12. The system of claim 9, wherein the processing circuitry is further configured to estimate instrument parameters, specimen characteristics, or both from the sparse dataset prior to computationally reconstructing an image of the specimen, or without computationally reconstructing an image of the specimen.

13. The system of claim 9, wherein the sparse data comprises streaming sparse data and the detector is further configured to acquire in a continuous or batch-wise manner.

14. The system of claim 9, wherein the processing circuitry is further configured to issue instrument control commands to operably connected electron microscope system components, the instrument control commands associated with the instrument parameters, the specimen characteristics, or both.

15. An electron microscope system comprising:
   an electron beam probe configured to sub-sample a specimen in a serial mode;
   a detector configured to acquire a sparse dataset from the electron beam probe sub-sampling the specimen; and
   processing circuitry coupled to the detector and configured to determine directly from the sparse dataset a baseline state of the specimen, the electron microscope system, or both prior to computational reconstruction of an image of the specimen, or without computational reconstruction of an image of the specimen, wherein the baseline state is based on an expanding or moving window baseline set, on a threshold value (c), and on at least one additional metric; to quantify distances of subsequent states of the specimen, the electron microscope, or both from the baseline state, wherein the subsequent states are determined directly from subsequent sparse datasets; and to compare the subsequent states to the baseline state.

16. The system of claim 15, wherein said quantifying the distance of subsequent states from the baseline state uses a regression-based approach.

17. The method of claim 1, wherein the baseline state is further based on an expanding or moving window baseline set and on a threshold value, c.

18. The method of claim 1, wherein the plurality of metrics comprise presence of image features, number of modes present in an intensity distribution, anode height estimation, proportion of growth of particles, proportion of number of particles, unimodality test statistic, standard deviation, Moran's I, or combinations thereof.

19. The method of claim 1, wherein said quantifying the distance of subsequent states is based on a statistical technique.

20. The method of claim 19, wherein said statistical technique comprises a regression-based approach.

21. The system of claim 9, wherein the baseline state is based further on an expanding or moving window baseline set and a threshold value, c.

22. The system of claim 9, wherein the processing circuitry is further configured to quantify using statistical techniques the distance of subsequent states of the specimen, the electron microscope, or both from the baseline state, wherein the subsequent states are determined directly from subsequent sparse datasets.

* * * * *